(12) United States Patent
Mielke

(10) Patent No.: US 12,339,308 B2
(45) Date of Patent: Jun. 24, 2025

(54) APPARATUS FOR TESTING A COMPONENT, METHOD OF TESTING THE COMPONENT, COMPUTER-READABLE STORAGE DEVICE FOR IMPLEMENTING THE METHOD, AND TEST ARRANGEMENT USING A MAGNETIC FIELD

(71) Applicant: Advantest Corporation, Tokyo (JP)

(72) Inventor: Frank Mielke, Willich (DE)

(73) Assignee: Advantest Corporation, Tokyo (JP)

( * ) Notice: Subject to any disclaimer, the term of this patent is extended or adjusted under 35 U.S.C. 154(b) by 219 days.

(21) Appl. No.: 18/069,233

(22) Filed: Dec. 21, 2022

(65) Prior Publication Data

US 2023/0119550 A1    Apr. 20, 2023

Related U.S. Application Data

(63) Continuation of application No. PCT/EP2021/052188, filed on Jan. 29, 2021.

(51) Int. Cl.
*G01R 31/26*    (2020.01)

(52) U.S. Cl.
CPC ............... *G01R 31/2601* (2013.01)

(58) Field of Classification Search
CPC ............ G01R 31/26; G01R 31/2601; G01R 31/318533; G01R 31/3187; G01R 31/31905; G01R 33/1207
See application file for complete search history.

(56) References Cited

U.S. PATENT DOCUMENTS

| | | | |
|---|---|---|---|
| 8,008,912 B1 | 8/2011 | Shang | |
| 2006/0049823 A1* | 3/2006 | Suzuki | G01R 31/2886 324/202 |

(Continued)

FOREIGN PATENT DOCUMENTS

JP    2000206205    7/2000

OTHER PUBLICATIONS

Jason Janesky, "Impact of External Magnetic Fields on MRAM Products," Freescale Semiconductor, Austin, TX, Nov. 2007, pp. 1-8.

(Continued)

*Primary Examiner* — Alesa Allgood
*Assistant Examiner* — Courtney G McDonnough
(74) *Attorney, Agent, or Firm* — Squire Patton Boggs LLP; Sarah Mirza

(57) ABSTRACT

The disclosure describes an apparatus for testing a component, wherein the apparatus is configured to apply a magnetic field with a magnetic field orientation from a set of magnetic field orientations to the component. The apparatus is further configured to perform a test on the component in the presence of the respective magnetic fields with the respective magnetic field orientations from the set of magnetic field orientations to obtain an information characterizing an operation of the component. The apparatus is also configured to determine a test result based on the information characterizing the operation of the component in the presence of different magnetic fields with different magnetic field orientations from the set of magnetic field orientations. The disclosure also describes a method of testing and a computer-readable storage device for implementing the method and provides more efficiency in view of reliability and costs.

19 Claims, 8 Drawing Sheets

(56) References Cited

U.S. PATENT DOCUMENTS

| | | |
|---|---|---|
| 2007/0120560 A1 | 5/2007 | Rempt |
| 2015/0042318 A1 | 2/2015 | Youm et al. |
| 2016/0276004 A1 | 9/2016 | Lance et al. |
| 2020/0096559 A1* | 3/2020 | Chuang ............... G11C 11/1673 |

OTHER PUBLICATIONS

Gabriela Alejandra Rodriguez Ruiz, "A 2D Simulation Methodology for Thermo-Magnetics Effects on Tunneling Mechanisms of Nano-scaled MOS Devices," dissertation, National Institute for Astrophysics, Optics and Electronics, Feb. 2015, Tonantzintla, Puebla, pp. I-XV and 1-60.

https://www.hprobe.com/products, LINX Platform, web page retrieved Dec. 2020.

* cited by examiner

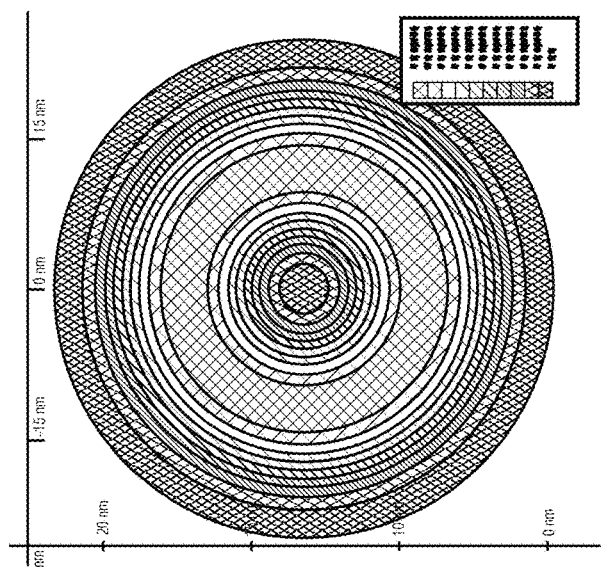
(c) B=500mT
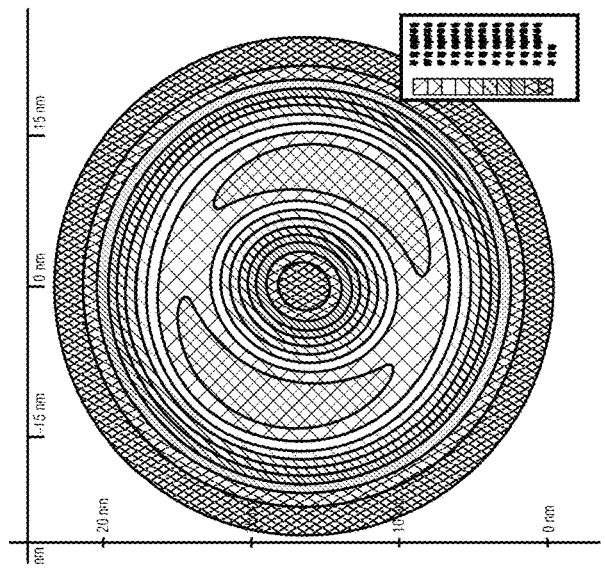
(b) B=50mT
Fig. 4c
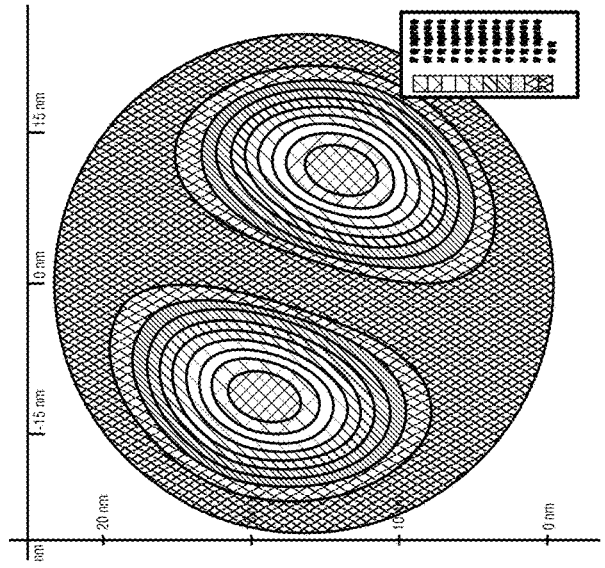
(a) B=0T

APPARATUS FOR TESTING A COMPONENT, METHOD OF TESTING THE COMPONENT, COMPUTER-READABLE STORAGE DEVICE FOR IMPLEMENTING THE METHOD, AND TEST ARRANGEMENT USING A MAGNETIC FIELD

CROSS-REFERENCE TO RELATED APPLICATION

This application is a continuation of copending International Application No. PCT/EP2021/052188, filed Jan. 29, 2021, which is incorporated herein by reference in its entirety.

TECHNICAL FIELD

Embodiments according to the disclosure are concerned with testing components, and particularly with component testing applied in a manufacturing process. Also, embodiments according to the disclosure are related to an apparatus for testing a component. Further, embodiments according to the disclosure are related to a method of testing the component. Furthermore, embodiments according to the disclosure are related to a computer-readable storage device including a plurality of computer-executable instructions stored therein for performing the method of testing the component. Moreover, embodiments according to the disclosure are related to a test arrangement. According to an aspect, embodiments according to the disclosure can be applied to provide a reliable and cost-effective manner of component testing by introducing new structural tests.

BACKGROUND

A multitude of testing apparatuses and methods used during manufacturing of components, such as complex semiconductor devices used, for example, in mobile radio applications or in automotive industry, are currently known. The known tests are used to detect faulty circuit parts and elements, thus ensuring functionality and quality of the components.

Some of the known methods include, for example, performing a structural test, such as, SCAN test for logic circuits or MBIST (memory built-in self test) for memory devices (e.g., integrated memories). The SCAN test involves scanning test patterns into internal circuits within the device under test or component under test. The MBIST (memory built-in self test) is a self-testing and repair mechanism which tests the memories through an effective set of algorithms to detect possibly all the faults that could be present inside a typical memory cell.

In the known testing apparatuses and methods, a lot of problems arise due to the increasing complexity and quality requirements, e.g., from an industry, such as the automotive industry, or due to new silicon technologies. Particularly, test gaps may arise upon testing, and test costs may increase heavily.

In view of the above, there is a desire to create a testing manner which provides an improved tradeoff between reliability and cost of test and which can be effectively used in the manufacturing processes.

SUMMARY

An embodiment according to the disclosure is directed to an apparatus for testing a component (e.g., a semiconductor device, such as a SOC (system-on-a chip) for mobile radio applications or for the automotive industry, or transistors (e.g., MOSFET)), where the testing is applied, for example, in a manufacturing process of the component. The apparatus is configured to apply a magnetic field (e.g., a 3D magnetic field, a static magnetic field, a dynamic magnetic field, or a quasi-static magnetic field) with a magnetic field orientation from a set of magnetic field orientations (e.g., a plurality, such as at least two different magnetic field orientations) to the component, such as by placing the component in the magnetic field. The magnetic field includes a magnetic B-field in an embodiment. The apparatus is configured to perform a test (e.g., a structural test and/or a functional test, such as a VLSI test) on the component in the presence of the respective magnetic field with the respective magnetic field orientation from the set of magnetic field orientations, to obtain an information (e.g. an information on a switching (voltage) threshold, a minimum voltage (Vmin), a switching speed, a functional frequency, a maximum functional frequency (Fmax), or an information whether an error occurred, such as a pass fail result of a structural or functional test) characterizing an operation of the component. The apparatus is configured to determine a test result on the basis of the information characterizing the operation of the component associated with the different magnetic fields with different magnetic field orientations from the set of magnetic field orientations.

The embodiment is based on the discovery that placing components in magnetic fields with different magnetic field orientations and measuring one or more parameters (e.g., parameters such as a switching (voltage) threshold, a minimum voltage (Vmin), a switching speed, a functional frequency, a maximum functional frequency (Fmax)) of the component allows using a difference (e.g., caused by the different magnetic field orientations) between values of the measured parameters in the presence of magnetic fields with different magnetic field orientations as a measure of a homogeneity or an inhomogeneity. The discovery is based on the finding that the Lorenz force along with quantum mechanical changes affect charge carriers so that they are pushed into different areas of the conductive material, changing characteristics of the device under test or the component under test due to magnetic fields of different magnetic field orientations. Consequently, this helps to improve test reliability. Thus, variations in line resistance (e.g., due to or caused by poorly filled vias) or the inhomogeneity of the gate material (e.g., due to doping, gate lengths, or fin dimensions) lead to different measurement results in the presence of magnetic fields of different magnetic field orientations. Some errors are often caused by inhomogeneous generation due to relatively large variances of manufacturing parameters, for example, causing switching threshold or switching speeds of transistors to not match the functionality goal of the application.

In conclusion, a reliability of a test result can be efficiently improved on the basis of information characterizing the operation of the component under test in the presence of magnetic fields of different magnetic field orientations, since variations in the information characterizing the operation of the component under test are dependent on the magnetic field orientation of the magnetic field and often correlate with (or indicate) reliability issues (e.g., poorly filled vias or inhomogeneous manufacturing processing conditions).

According to an embodiment, the apparatus is configured to perform structural tests, during which a plurality of digital test patterns are applied to the component as a stimulus, and during which responses of the component to the plurality of digital test patterns are evaluated, in the presence of the respective magnetic fields with the respective magnetic field orientations from the set of magnetic field orientations. This increases an accuracy of the revealing of errors. For example, it has been found that a magnetic field may, at least in one orientation, constitute an (e.g., additional) stress factor for the component under test, such that a successful execution of structural tests even for magnetic fields with different magnetic field orientations may indicate that the component under test will have a sufficient error tolerance under normal operating conditions (e.g., in the absence of a magnetic field). On the other hand, if the presence of a magnetic field with a particular magnetic field orientation results in a failure, it can be assumed that a component has a reliability issue (e.g., even if the magnetic field used during the test is significantly stronger than magnetic fields which occur during the normal operation of the component).

According to an embodiment, the apparatus is configured to perform identical structural tests in the presence of different magnetic fields (e.g., in the presence of magnetic fields of different magnetic field orientations and/or different field strengths). This increases an accuracy of the revealing of errors. Also, comparison of information characterizing the operation of the component for different magnetic field orientations of the magnetic field may indicate a sensitivity to the magnetic field, which may, for example, correlate with reliability issues.

According to an embodiment, the apparatus is configured to determine, as the information characterizing the operation of the component, one or more performance metrics (e.g., physical parameters, manufacturing parameters, a temperature, a current consumption, a switching (voltage) threshold, a minimum voltage (Vmin), a switching speed, a functional frequency, a maximum functional frequency (Fmax), a power consumption, etc.) of the component in the presence of a plurality of different magnetic fields with different magnetic field orientations and/or different field strengths. Use of the additional parameters provides additional information on sources of error or on quality risks, which can significantly improve the quality of deliveries in the manufacturing process. For example, a dependency of the one or more performance metrics on the magnetic field, or a correlation of the one or more performance metrics with the magnetic field, may be determined, and may be used for a classification of the device under test or the component under test. For example, if the dependency exceeds a predetermined threshold, a device may be classified as faulty or as having a reliability risk.

According to an embodiment, the apparatus is configured to determine the test result based on a difference of the information characterizing the operation of the component associated with different magnetic fields with different magnetic field orientations and/or different field strengths. The difference may, for example, show a level of the homogeneity or an inhomogeneity, thus may accurately indicate errors occurred (or reliability risks).

According to an embodiment, the apparatus is configured to perform a test on a semiconductor device including a plurality of, coupled or interacting, logical functionalities, (e.g., a complex semiconductor device) in the presence of a plurality of magnetic fields with different magnetic field orientations and/or different field strengths. This avoids test gaps arising due to complexity of the complex semiconductor device and provides more reliable test results. By performing a complex logical test (e.g., a logic pattern-based test), which evaluates an interaction of the plurality of logical functionalities, the impact of the magnetic field on an overall functionality of the component under test can be evaluated. This goes far beyond a mere classification of a single transistor, since an effect of the magnetic field on a plurality of logical functionalities may "sum up" such that a single transistor may still be operational while an overall logic functionality still fails. Thus, it has been found that a complex logical test in the presence of magnetic fields with different magnetic field orientations may provide a significantly better classification of a component in comparison to the mere classification of a single transistor.

According to an embodiment, the apparatus is configured to perform a test on a complex semiconductor device (e.g., a system-on-a-chip, a multi-chip-module (MCM), a system-test board, etc.) in the presence of a plurality of magnetic fields with different magnetic field orientations and/or different field strengths. This avoids test gaps arising due to complexity of the complex semiconductor device and provides more reliable test results. Also, an impact of the magnetic field on the overall functionality (or on overall performance metrics characterizing the operation of the component) is evaluated.

According to an embodiment, the apparatus is configured to apply a magnetic field (e.g., a 3D magnetic field, a static magnetic field, a dynamic magnetic field, or a quasi-static magnetic field) with a magnetic field orientation from a set of magnetic field orientations (e.g., a plurality, such as at least two different magnetic field orientations), such as by placing the component in the magnetic field or by applying the magnetic field to the component. The apparatus is configured to perform a test (e.g., a structural test, a functional test, etc.) on the component in the presence of the respective magnetic fields (e.g., a 3D magnetic field, a static magnetic field, a dynamic magnetic field, or a quasi-static magnetic field) with respective magnetic field orientations from the set of magnetic field orientations to obtain the information (e.g. an information on a switching (voltage) threshold, a minimum voltage (Vmin), a switching speed, a functional frequency, a maximum functional frequency (Fmax), power consumption, or an information whether an error occurred, such as a pass fail result of a structural or functional test, or such as due to inhomogeneity of transistor gate material, inhomogeneous line resistance resulting from poorly filled vias, etc.) characterizing the operation of the component. Use of static or quasi-static magnetic fields increases a precision of the performed measurements due to excluding an influence of frequency fluctuations of the magnetic field on the parameters of the components to be measured. Also, by using static or quasi-static magnetic fields, an impact of an induced voltage in the component under test is negligible. In particular, it has been found that a static or quasi-static magnetic field allows clear identification of reliability issues which are caused by manufacturing processing imperfections such as anisotropies or inhomogeneity. For example, by using static or quasi-static magnetic fields, quantum effects may be caused which change the characteristics of strongly miniaturized transistors or even that of conductive structures. At the same time, by using static or quasi static magnetic fields, undesired induction effects, which would overlay on the desired analysis of quantum effects, are avoided (or reduced down to irrelevance). Thus, the reliability of very small structures (e.g., miniaturized transistors) can be analyzed efficiently using static or quasi-static magnetic fields with different magnetic field orientations.

According to an embodiment, the apparatus includes a magnetic field generator (e.g., one or more coils or a coil arrangement) configured to generate the magnetic fields in a well-controlled manner and/or in temporal coordination with the test. This provides an autonomous usage of the apparatus without requiring external sources for the magnetic field. Also, by coordinating the magnetic field with a test flow (e.g., with the execution of a pattern-based test program), a correlation between the magnetic field and test results (e.g., wrong digital response values of the component under test) can be determined. This may be helpful in a fault analysis.

According to an embodiment, the apparatus is configured to apply the magnetic field as a stress component during the test, for example, a high magnetic field of about 1 T (Tesla) could be applied to implement a test scenario. Placing a component in a strong magnetic field, e.g., about 1 T (tesla), causes parameters of the component to change depending on a magnetic field orientation. This allows finding errors caused by inhomogeneous generation (e.g., caused by inhomogeneity in the semiconductor fabrication process). Depending on behavior under magnetic stress, it is possible to detect a reliability problem of single components, e.g., to detect single transistors which have a reliability problem.

Stress scenarios (e.g., applying high temperature or low voltage) can be combined with a high magnetic field in order to improve the revealing of errors.

According to an embodiment, the apparatus is configured to provide the test result. The test result indicates a quality risk if the magnetic field application results in a non-tolerant operation of the component. This leads to a significant improvement of the quality of the component deliveries from the manufacturing process.

According to an embodiment, the apparatus is configured to provide the test result. The test result includes an information about a homogeneity of a manufacturing process, which may, for example, be based on a magnetic field dependent variation of one or more characteristics of the component. This allows finding errors caused by inhomogeneous generation (e.g., poorly filled vias, the inhomogeneity of the gate material, such as due to doping, gate lengths or fin dimensions, or where switching threshold or switching speeds of transistors do not match the functionality goal of the application) due to relatively large variations of manufacturing parameters.

According to an embodiment, the apparatus is configured to perform (e.g., control or trigger) the memory built-in self test in different magnetic fields with different magnetic field orientations. The usage of the apparatus to detect errors in memory devices (e.g., integrated memories) is thus provided.

According to an embodiment, the apparatus is configured to evaluate current consumption in different magnetic fields with different magnetic field orientations. This improves a characterization of various parameters (e.g., a minimum switching (voltage) threshold (Vmin), a maximum functional frequency (Fmax), etc.) during performance of testing, thus improving a test efficiency due to applying a combination of different test approaches. Moreover, it has been found that a variation of the current consumption in different magnetic fields with different magnetic field orientations often correlates with reliability issues of the device under test or the component under test. Thus, a magnitude of a variation of the current consumption with application of the magnetic field can be used to determine the test result (e.g., where a variation of the current consumption is larger than a fixed or variable threshold value may result in a classification of a component under test as unreliable).

According to an embodiment, the apparatus is configured to evaluate quiescent current for different magnetic fields with different magnetic field orientations. This improves a test efficiency due to applying a combination of different test approaches. Moreover, it has been found that a variation of the quiescent current with the magnetic field often correlates with reliability issues of the device under test or the component under test. Thus, a magnitude of a variation of the quiescent current with the magnetic field can be used to determine the test result (e.g., where a variation of the quiescent current which is larger than a fixed or variable threshold value may result in a classification of a component under test as unreliable).

According to an embodiment, the apparatus is configured to compare the information characterizing the operation of the component (e.g., in the presence of the magnetic field) with a corresponding predetermined threshold to determine the test result. Using a threshold in testing provides an improved reliability of the testing due to an improved analyzation of the testing measurement results.

According to embodiments, the magnetic field has a strength of at least 100 mT (tesla), at least 300 mT (tesla), at least 500 mT (tesla), or at least 800 mT (tesla). Placing a component in a strong magnetic field (e.g., about 1 T (tesla)) causes parameters of the component to change depending on a magnetic field orientation (even for a static or quasi-static magnetic field). This leads to finding errors (e.g., on the basis of an evaluation of the information characterizing the operation of the component) caused by inhomogeneous generation.

According to an embodiment, the information characterizing the operation of the component includes at least one of: a temperature, a current consumption, a switching (voltage) threshold, a switching speed, a functional frequency (e.g., maximum frequency), a power consumption, a transconductance, a subthreshold voltage, a leakage current, or a subthreshold slope. Using additional parameters provides additional information on sources of error or on quality risks, which can significantly improve the quality of component deliveries from the manufacturing process.

According to an embodiment, the apparatus is configured to present the test results to a user. This enables a control of the manufacturing process and adjustment to the manufacturing process in order to reduce or avoid errors.

According to an embodiment, the apparatus is configured to forward the test results to a remote server. This enables a remote and automatic control of the manufacturing process and the remote and automatic adjustment of the manufacturing process in order to reduce or avoid errors.

An embodiment according to the disclosure is directed to a method of testing a component (e.g., a semiconductor device, such as a SOC (system-on-a chip) for mobile radio applications or automotive industry applications, or transistors (e.g., MOSFET)), where the testing is applied in a manufacturing process of the component. The method includes: applying a magnetic field (e.g., a static magnetic field, a dynamic magnetic field, a quasi-static magnetic field, or a 3D magnetic field) with a magnetic field orientation from a set of magnetic field orientations (e.g., a plurality, such as at least two different magnetic field orientations) to the component (e.g., by placing the component in the magnetic field); performing a test (e.g., a structural test and/or a functional test) on the component in the presence of the respective magnetic field (e.g., a static magnetic field, a dynamic magnetic field, a quasi-static magnetic field, or a 3D magnetic field) with the respective magnetic field orientation to obtain an information (e.g., an information on a switching (voltage) threshold, a minimum voltage (Vmin), a switching speed, a functional frequency, such as a maximum functional frequency (Fmax), or an information whether an error occurred) characterizing an operation of the component; and determining a test result on the basis of the information characterizing the operation of the component associated with different magnetic fields with different magnetic field orientations from the set of magnetic field orientations.

The method according to this embodiment is based on the considerations discussed with respect to an apparatus for testing described above. Moreover, this disclosed embodiment may optionally be supplemented by any other features, functionalities, and details disclosed herein in connection with the apparatus for testing, both individually and taken in combination.

An embodiment according to the disclosure is directed to a computer-readable storage device storing a computer program having a program code for performing the methods according to any of the embodiments described above. Also, the computer-readable storage device includes a plurality of computer-executable instructions stored therein for performing the methods of testing the component.

An embodiment according to the disclosure is directed to a test arrangement including an apparatus according to any of the embodiments described above. The apparatus also includes at least one source (e.g., a generator) of a magnetic field (e.g., a static magnetic field, a dynamic magnetic field, a quasi-static magnetic field, or a 3D magnetic field) configured to provide (e.g., to generate) a magnetic field with a magnetic field orientation from a set of magnetic field orientations (e.g., a plurality, such as at least two different magnetic field orientations) to the component (e.g., by placing the component in the magnetic field), and further includes a component to be tested, where the component includes a test circuit configured to interact with the magnetic field provided (e.g., generated) by the at least one source (e.g., a generator) of a magnetic field (e.g., a static magnetic field, a dynamic magnetic field, a quasi-static magnetic field, or a 3D magnetic field).

The test arrangement according to this embodiment is based on the considerations discussed with respect to an apparatus for testing described above. Moreover, this disclosed embodiment may optionally be supplemented by any other features, functionalities, and details disclosed herein in connection with the apparatus for testing, both individually and taken in combination.

These and further advantageous aspects are the subject of the claims.

The apparatus for testing a component, the method of testing a component, the computer-readable storage device for implementing this method, and the test arrangement described above may optionally be supplemented by any of the features, functionalities, and details disclosed herein, both individually and taken in combination.

This summary is provided to introduce a selection of principles of the disclosure in a simplified form that are further described below in the Detailed Description section. This summary is not intended to identify key features or essential features of the claimed subject matter, nor is it intended to be used to limit the scope of the claimed subject matter.

BRIEF DESCRIPTION OF THE DRAWINGS

The accompanying drawings, which are incorporated in and form a part of this specification, illustrate embodiments, together with the description, serve to explain the principles of the disclosure.

Embodiments of the present disclosure are set out below in the figures.

FIG. 4C shows further measurements performed for a circular nanowire upon applying a magnetic field perpendicular to the surface of the MOSFET according to a conventional apparatus.

DETAILED DESCRIPTION

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications, and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

Figure 1:
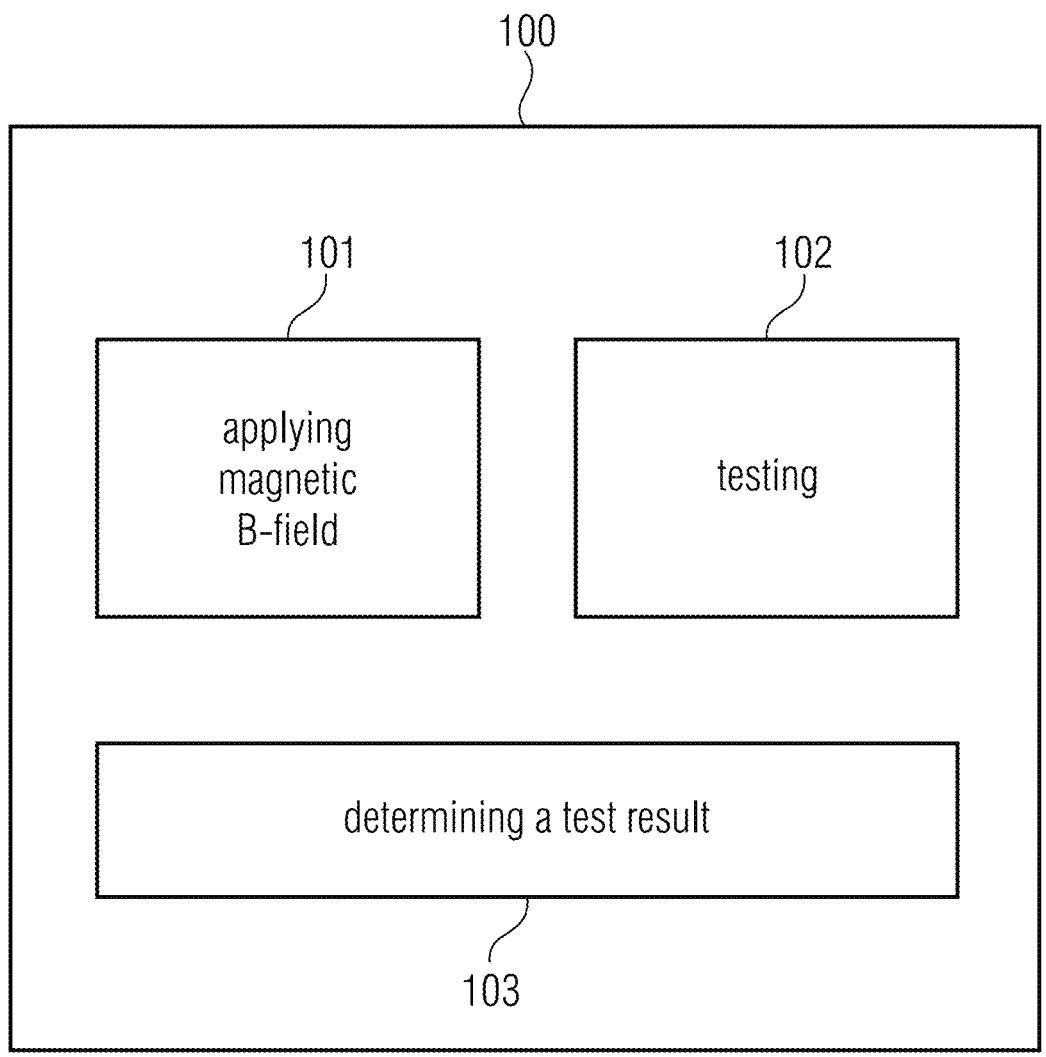
FIG. 1 shows an apparatus for testing in accordance with an embodiment.

FIG. 1 shows an apparatus 100 for testing a component in accordance with an embodiment.

The apparatus 100 is configured to apply magnetic fields with different magnetic field orientations from a set of magnetic field orientations (e.g., a plurality, such as at least two different magnetic field orientations) to a component under test. This functionality is shown by apparatus subportion 101 in FIG. 1. The apparatus 100 is configured to apply a magnetic field (e.g., a 3D magnetic field, a static magnetic field, a dynamic magnetic field, or a quasi-static magnetic field) with a magnetic field orientation from the set of magnetic field orientations. The magnetic field includes a magnetic B-field in an embodiment. The component under test is, for example, placed in the magnetic field, which may be a high magnetic field. The high magnetic field may, for example, have a strength of at least 100 mT (tesla), at least 300 mT (tesla), at least 500 mT (tesla), at least 800 mT (tesla), or at least 1 T (tesla). It has been found that placing a component in a strong magnetic field (e.g., about 1 T (tesla)) causes parameters of the component, during evaluation using a structural or functional test on the component, to change depending on a magnetic field orientation of the magnetic field. This allows finding errors caused by inhomogeneous generation due to variances of manufacturing parameters. For example, overall parameters of the component under test, which may include a large number of transistors forming a (e.g., digital or analog) circuit structure, may be determined using a structural or functional test (e.g., typically tests an interaction of tens, hundreds, thousands, or even millions of transistors of the component, or of (complex) functional blocks of the component under test) on the component under test. The overall parameters may, for example, describe a functionality (e.g., a performance or an overall electric characteristic) of the component under test (e.g., having at least a hundred, at least a thousand, or even at least a million transistors) in its entirety, or at least a functionality (e.g., a performance or an overall electrical characteristic) of a functional block of the component under test (e.g., having at least a hundred, at least a thousand, or even at least a million transistors) in its entirety. Thus, the impact of the magnetic field with a magnetic field orientation on a complex functional block (e.g., having at least a hundred, at least a thousand, or even at least a million transistors) may be evaluated and considered in the determination of the test result. Applying a high magnetic field is a stress scenario to be used for testing a component under test. Stress scenarios, such as applying high temperature or low voltage, can be combined with the high magnetic field with a magnetic field orientation in order to improve the revealing of errors.

The apparatus 100 may comprise a magnetic field generator (not shown), such as a coil, a set of coils, or a coil arrangement, which generates a magnetic field. The magnetic field may be generated in a controlled manner and/or in a temporal coordination with a test of the component under test performed by the apparatus 100. The test may, for example, include a generation of a digital test pattern which stimulates the component under test, and the evaluation of a response (e.g., in the form of a response pattern) of the component under test to the digital test pattern. Alternatively or in addition, if the component under test is a SOC (system-on-a chip), the test may include control of the SOC. Optionally, analog stimulus signals may also be applied to the component under test. Examples of analog stimulus signals include modulated high frequency signals or the like. Furthermore, the test may include a measurement of analog parameters (e.g., a current consumption) of the component under test while performing the test (e.g., a digital pattern test is running or a system-on-a-chip test is running). Moreover, the test may, for example, include a variation of one or more additional operation conditions (e.g., a variation of a clock frequency, a supply voltage, a data rate, a temperature, etc.) of the component under test to thereby put stress on the component under test and to find maximum allowable operating conditions.

At least two of the different magnetic field orientations of the applied magnetic field may be used in order to perform a corresponding test on the component under test. When components under test are placed in a respective magnetic field with a respective magnetic field orientation and usual parameters of the components under test are measured for different magnetic fields with different magnetic field orientations, a difference between values of the measured parameters for different magnetic fields with different magnetic field orientations shows a measure, a level, or a degree of the homogeneity or an inhomogeneity. The Lorenz force along with quantum mechanical changes affect charge carriers, pushing the charge carriers into different areas of the conductive material. Thus, variations in line resistance (e.g., due to poorly filled vias) or the inhomogeneity of the gate material (e.g., due to variations in doping, gate lengths, or fin dimensions) lead to different measurement results. Accordingly, the difference between values of the measured parameters can be used to determine a test result.

The apparatus 100 may be used to test a semiconductor device including a plurality of, coupled or interacting, logical functionalities. Examples of such a semiconductor device include a complex semiconductor device, a system-on-a-chip, a multi-chip-module (MCM), or a system-test board.

The apparatus 100 is thus further configured to perform a test (e.g., a structural test and/or a functional test) on the component under test in the presence of the respective magnetic fields with the respective magnetic field orientations to obtain an information characterizing an operation of the component under test. This functionality is shown by apparatus subportion 102 in FIG. 1. An information (e.g., an information whether an error occurred or an information on a switching (voltage) threshold, a minimum voltage (Vmin) useable to operate the component under test without errors, a switching speed, a functional frequency (e.g., a maximum clock frequency that can be applied to the component under test without having errors, or a maximum functional frequency (Fmax)), a temperature, a current consumption, a power consumption, a transconductance, a subthreshold voltage, a leakage current, a subthreshold slope, etc.) is obtained from the test to characterize the operation of the component under test. Using these additional parameters improves the testing (e.g., structural testing and/or functional testing) performed by the apparatus 100.

The apparatus 100 may perform, in the presence of the magnetic field with the magnetic field orientation, structural tests during which a plurality of digital test patterns are applied to the component under test as a stimulus and during which responses of the component under test to the plurality of digital test patterns are evaluated. The apparatus 100 may perform identical structural tests in the presence of different magnetic fields (e.g., in the presence of magnetic fields of different magnetic field orientations and/or different magnetic field strengths).

The apparatus 100 may be operated in a manufacturing process (e.g., in the automotive industry or in a test facility testing unpackaged or packaged components after fabrication) of a component. Also, the apparatus 100 can be implemented, for example, as a part of a manufacturing system or be integrated in a manufacturing line. The apparatus 100 can be used for testing different components (e.g., a semiconductor device, SOC for mobile radio applications or for the automotive industry, transistors (e.g., MOSFET), etc.).

The apparatus 100 is further configured to determine a test result based on the information characterizing the operation of the component associated with different magnetic fields of different magnetic field orientations and/or different magnetic field strengths. This is shown by apparatus subportion 103 in FIG. 1. To determine the test result, the apparatus 100 may compare the information characterizing the operation of the component with a corresponding predetermined threshold to determine the test result. The threshold may be predetermined prior to the testing or may be determined and/or updated in real time during the testing.

The apparatus 100 may present the test result to a user, which may make a decision on making adjustments to the manufacturing process in case errors occur in the component(s). The apparatus 100 may also forward the test result to a remote server for further control and adjustment of the manufacturing process, or for storing the test result on the remote server. Since the apparatus 100 may be integrated into a manufacturing line, the apparatus 100 may forward the test result directly to a control unit of the manufacturing line.

The test result may indicate a quality risk, for example, if application of the magnetic field with the magnetic field orientation results in abnormal operation of the component, leading to categorizing the component as non-tolerant to environmental variations. The test result may include an information about a homogeneity of a manufacturing process, which may, for example, be based on a magnetic-field-dependent variation of one or more characteristics of the component.

However, it should be noted that the apparatus 100 may optionally be supplemented with any of the features, functionalities, and details disclosed herein, both individually or taken in combination.

Figure 2:
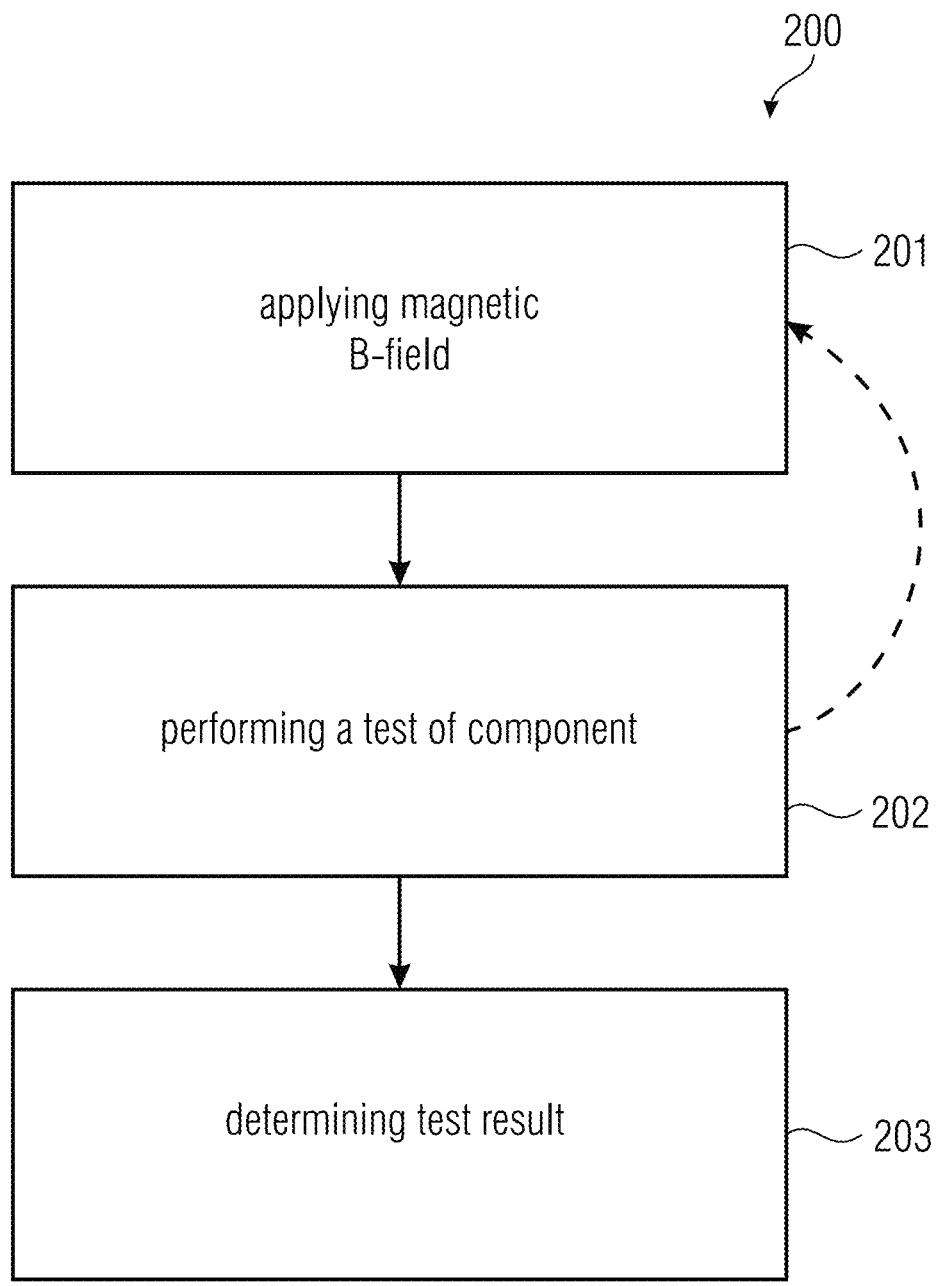
FIG. 2 shows a method of testing in accordance with an embodiment.

FIG. 2 shows a method 200 of testing a component in accordance with an embodiment.

The method 200 includes applying at step 201 a magnetic field with a magnetic field orientation from a set of magnetic field orientations to the component. The magnetic field applied may be a 3D magnetic field, a static magnetic field, a dynamic magnetic field, or a quasi-static magnetic field with a magnetic field orientation from the set of magnetic field orientations (e.g., a plurality of different magnetic field orientations). The component is, for example, placed in the magnetic field (or exposed to the magnetic field) at step 201. A high (or strong) magnetic field having a strength of at least 100 mT (tesla), at least 300 mT (tesla), at least 500 mT (tesla), at least 800 mT (tesla), or at least 1 T (tesla) may be used.

The method 200 further includes performing at step 202 a test (e.g., a structural test and/or a functional test) on the component in the presence of the respective magnetic field with the respective magnetic field orientation to obtain an information characterizing an operation of the component. The information obtained to characterize the operation of the component may include an information whether an error occurred or an information on a switching (voltage) threshold, a minimum voltage (Vmin), a switching speed, a functional frequency, a maximum functional frequency (Fmax), a temperature, a current consumption, a power consumption, a transconductance, a subthreshold voltage, a leakage current, or a subthreshold slope.

Steps 201 and 202 may be performed, for example, repeatedly in a loop (e.g., for different components, for performing several measurements, or for a set of measurements) to receive a set of information items obtained to characterize the operation of the components. Therefore, several measurements could be done at steps 201 and 202 before determining a test result at a next step 203.

The method 200 further includes determining at step 203 a test result based on the information determined at step 202 (e.g., on the basis of the set of information items received based on the set of the measurements performed) characterizing the operation of the component associated with different magnetic fields of different magnetic field orientations and/or different magnetic field strengths. The test result may indicate a quality risk, for example, if the application of the magnetic field with the magnetic field orientation results in abnormal operation of the component, leading to categorizing the component as non-tolerant to environmental variations. The test result may include an information about a homogeneity of a manufacturing process, which may, for example, be based on a magnetic-field-dependent variation of one or more characteristics of the component. As indicated above, several measurements could be done at steps 201 and 202 before determining the test result at step 203. Therefore, the test result at step 203 may provide, for example, a pass/fail judgement, which could come from a difference between different measurements performed at steps 201 and 202.

The test result determined at step 203 may be presented to a user, forwarded to a remote server, or stored on the remote server.

However, it should be noted that the method 200 may optionally be supplemented with any of the features, functionalities, and details disclosed herein, both individually or taken in combination.

Figure 3:
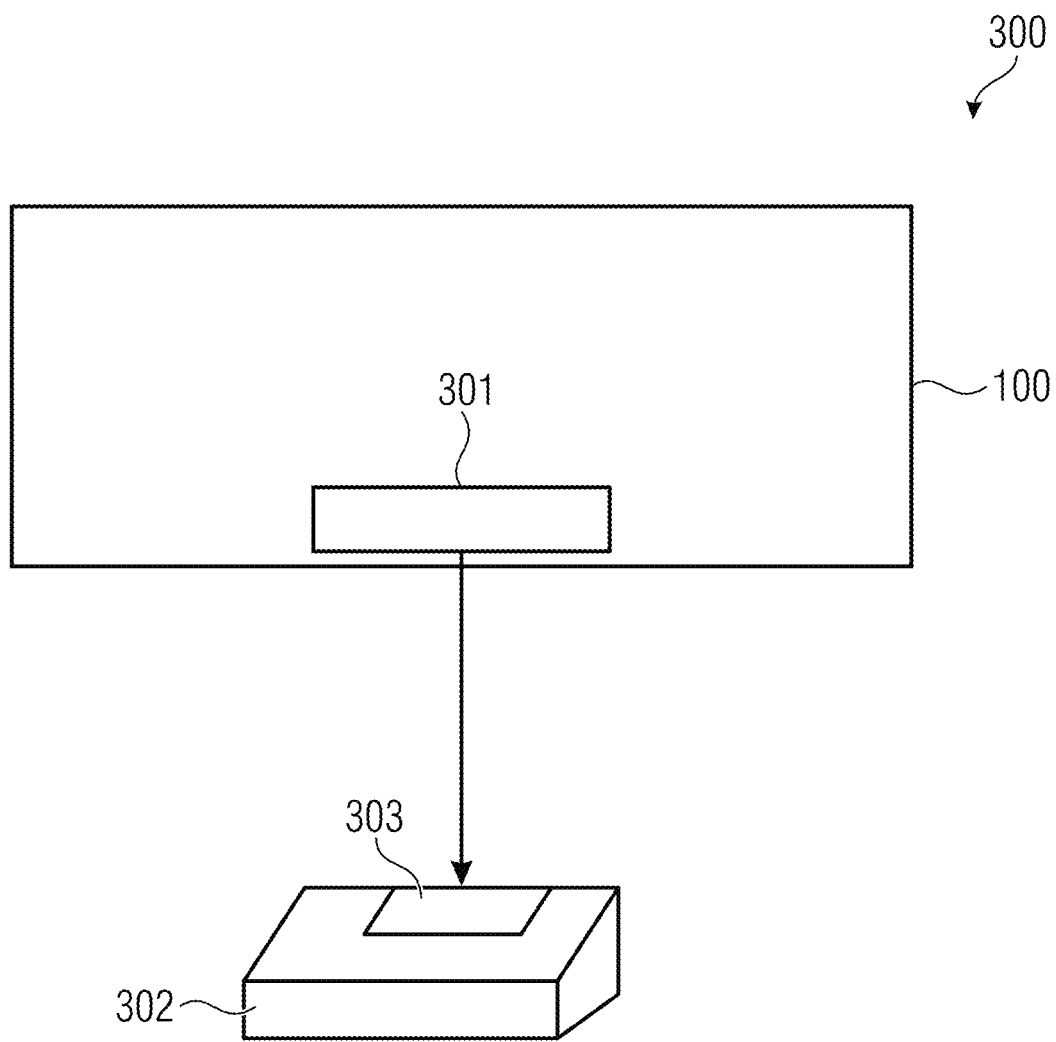
FIG. 3 shows a test arrangement in accordance with an embodiment.

FIG. 3 shows a test arrangement 300 in according with an embodiment. The test arrangement 300 includes an apparatus 100 (described herein). A component 302 to be tested is also shown in FIG. 3. The apparatus 100 is implemented in accordance with any of the embodiments described herein. The apparatus 100 includes at least one source 301 (e.g., a generator) of a magnetic field, where the at least one source 301 is configured to provide (e.g., to generate) a magnetic field with a magnetic field orientation from a set of magnetic field orientations to the component 302. The component 302 may be placed in the magnetic field with the magnetic field orientation originating from the at least one source 301 of the magnetic field. The component 302 to be tested may include a test circuit 303 configured to interact with the magnetic field with the magnetic field orientation provided by the at least one source 301 of the magnetic field.

The apparatus 100 of the test arrangement 300 performs testing of the component 302 to determine a test result.

However, it should be noted that the test arrangement 300 may optionally be supplemented with any of the features, functionalities, and details disclosed herein, both individually or taken in combination.

Figure 4A:
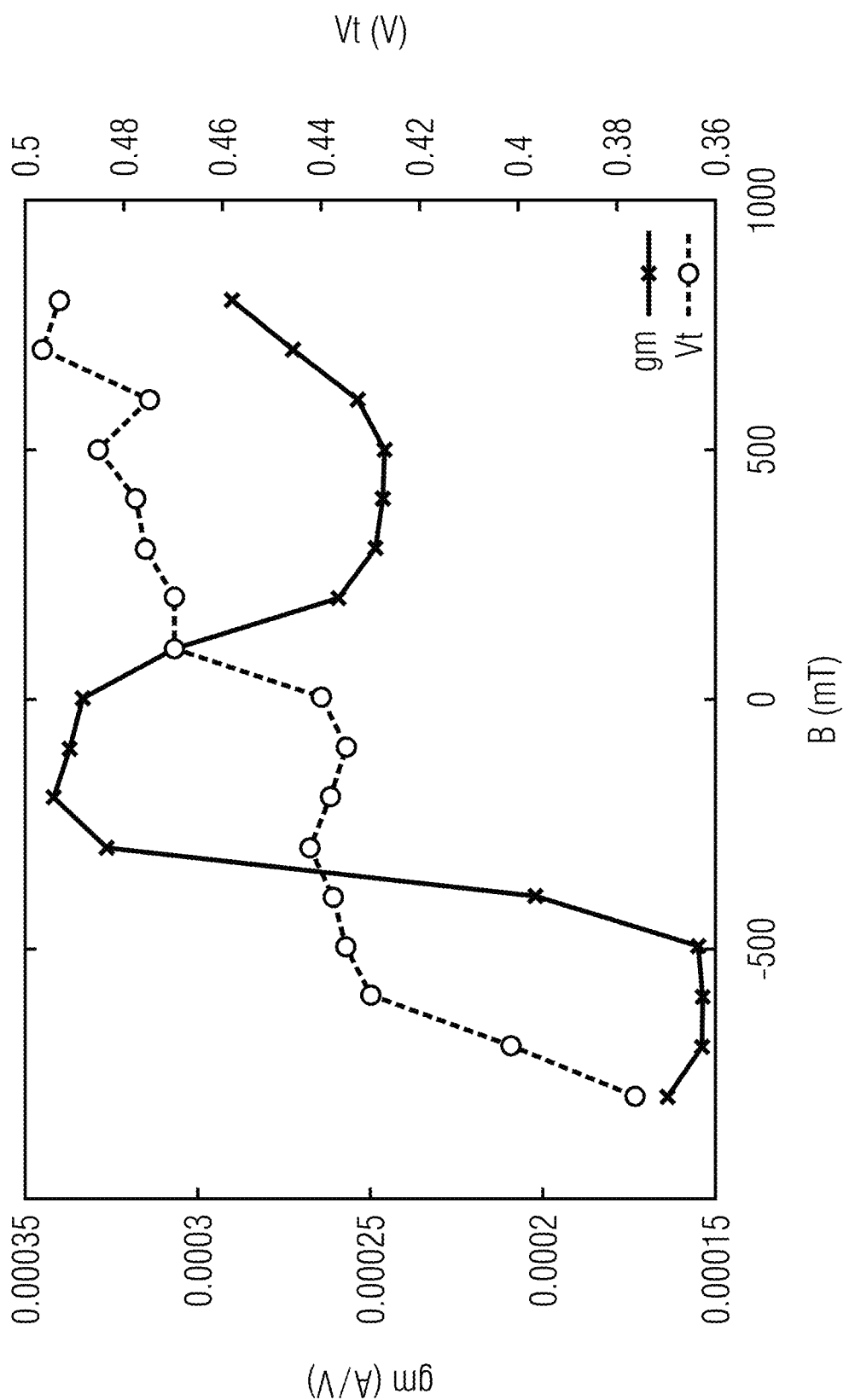
FIG. 4A shows measurements performed for 28-mm n-MOSFET upon applying a magnetic field perpendicular to the surface of the MOSFET according to a conventional apparatus.

FIG. 4A shows measurements performed for 28-mm n-MOSFET upon applying a magnetic field perpendicular to the surface of the MOSFET according to a conventional apparatus. More specifically, FIG. 4A shows a measurement of the transconductance gm and subthreshold voltage Vt for 28-mm n-MOSFET as a function of a magnetic field applied perpendicular to the surface of the MOSFET with $V_{DS}$=0.1 V.

Figure 4B:
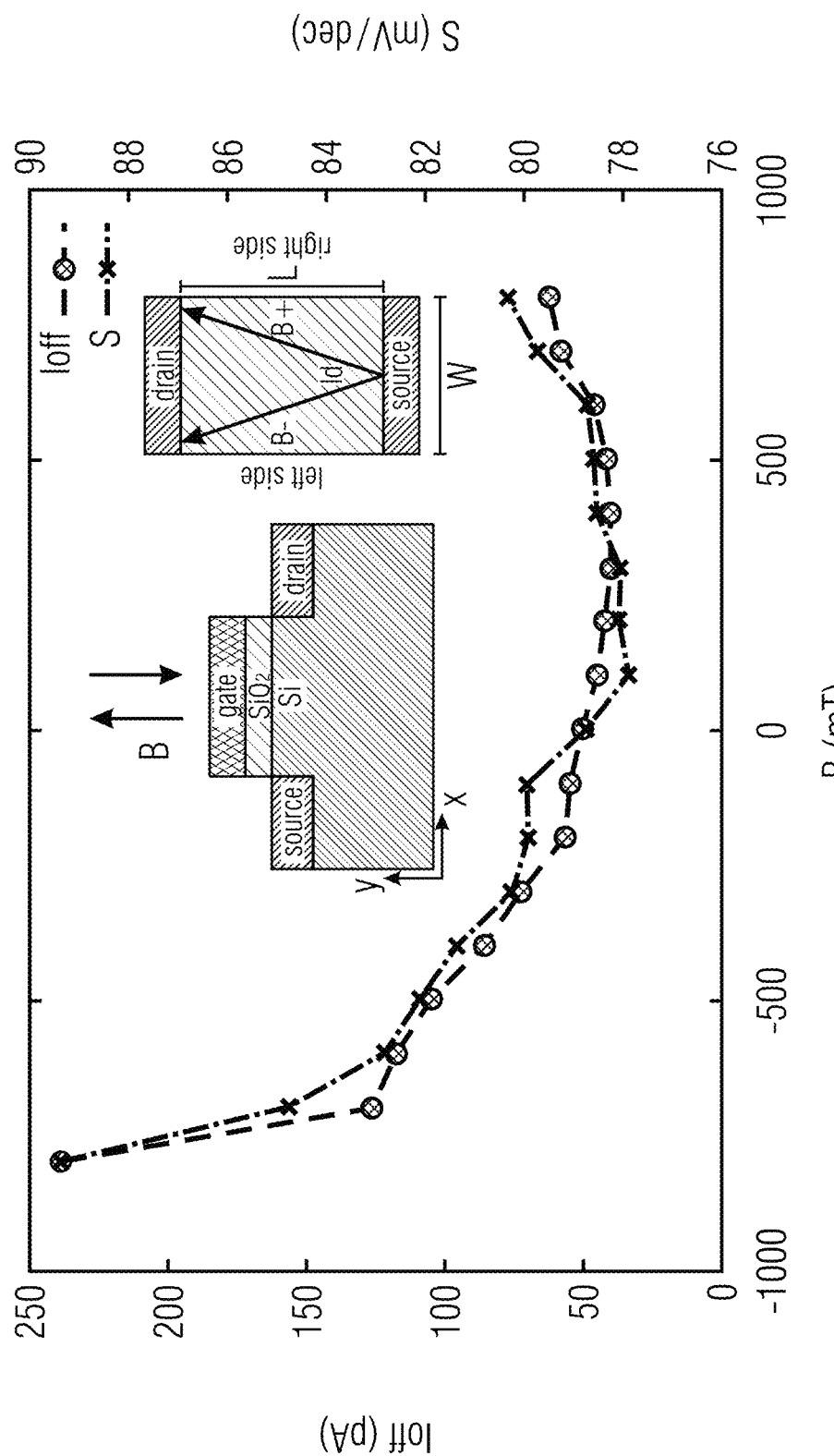
FIG. 4B shows additional measurements performed for 28-mm n-MOSFET upon applying a magnetic field perpendicular to the surface of the MOSFET according to a conventional apparatus.

FIG. 4B shows additional measurements performed for 28-mm n-MOSFET upon applying a magnetic field perpendicular to the surface of the MOSFET according to a conventional apparatus. More specifically, FIG. 4B shows a measurement of the leakage current Ioll and subthreshold slope S for 28-mm n-MOSFET as a function of a magnetic field applied perpendicular to the surface of the MOSFET with $V_{DS}$=0.1 V.

FIG. 4C shows further measurements performed for a circular nanowire upon applying a magnetic field perpendicular to the surface of the MOSFET according to a conventional apparatus. More specifically, FIG. 4C shows a probability density $|\psi|^2$ of a second level wavefunction of a cross section of a circular nanowire under the influence of a magnetic field applied perpendicular to the xy plane.

Figure 5:
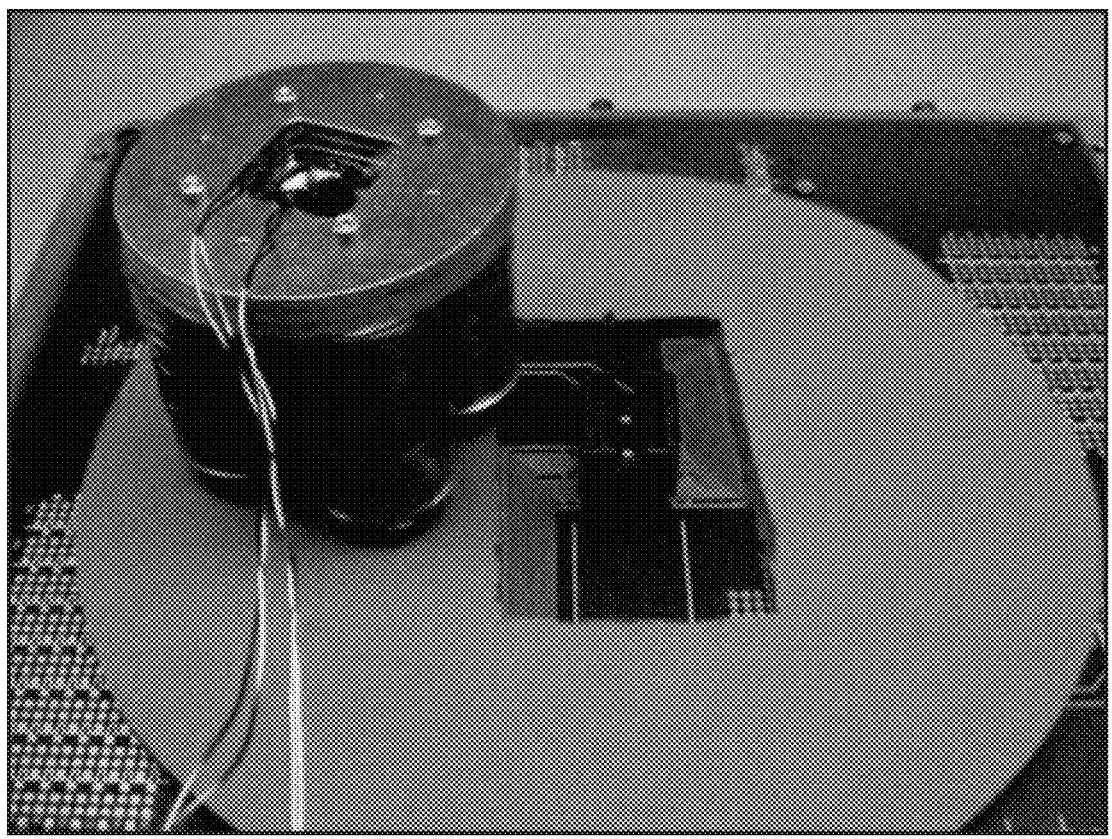
FIG. 5 shows a magnetic field generator according to a conventional apparatus.

FIG. 5 shows a magnetic field generator according to a conventional apparatus. More specifically, FIG. 5 shows an example of a magnetic field generator used in testing MRAM field sensitivity, particularly field-generating coils arranged near socket in order to test MRAM field sensitivity. FIG. 5 shows a quadruple magnet capable of producing magnetic field of several hundred gauss in any direction within the plane of the part A Helmholtz pair (not shown), which is used to generate a field perpendicular to the part A Helmholtz pair (not shown).

Figure 6:
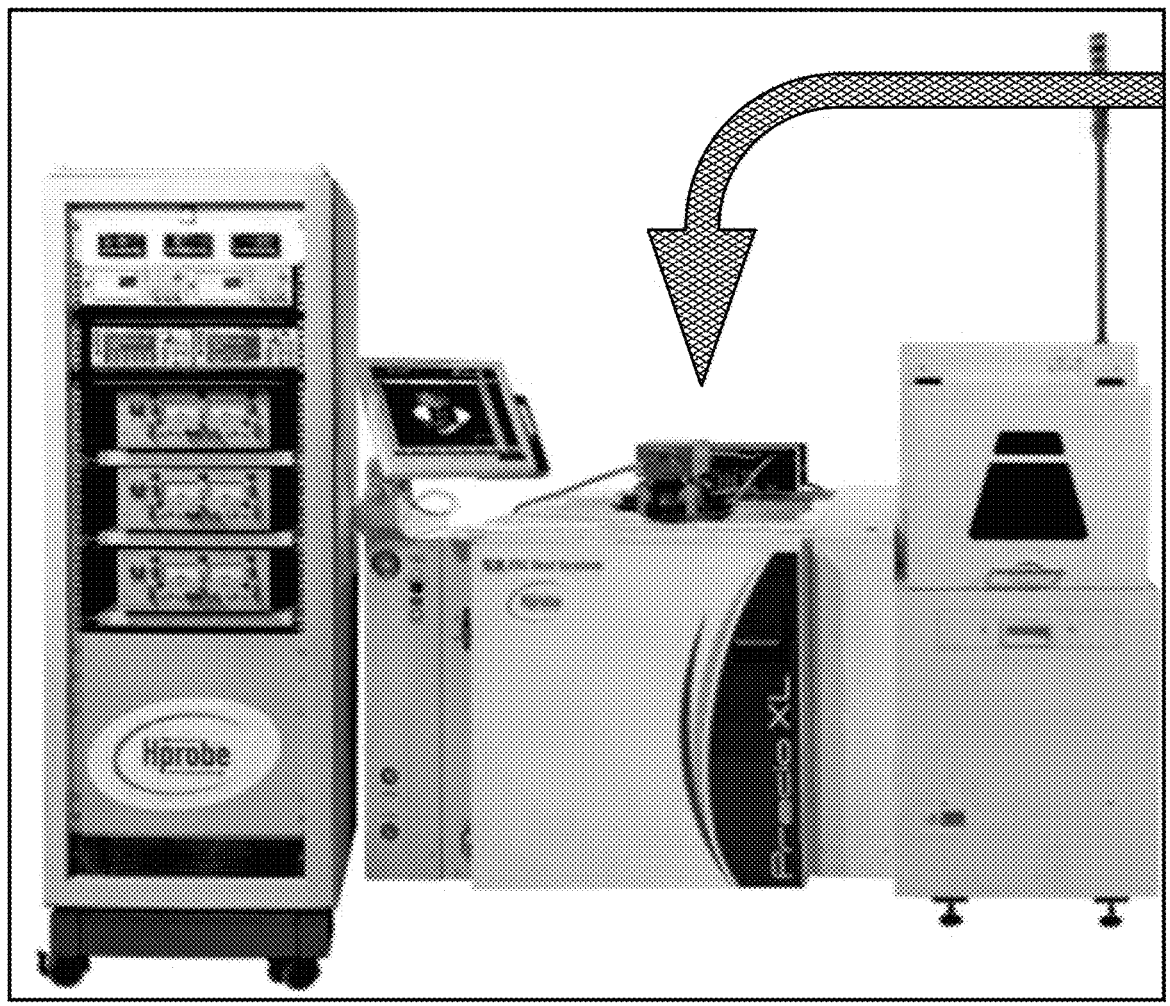
FIG. 6 shows a test arrangement according to a conventional apparatus.

FIG. 6 shows a test arrangement according to a conventional apparatus. More specifically, FIG. 6 shows an example of a test arrangement showing the applying of the magnetic field used in MRAM testing.

Also, any of the features and functionalities described herein can be implemented in hardware or in software, or using a combination of hardware and software.

Although some aspects are described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the method steps may be executed by such an apparatus.

Depending on certain implementation requirements, embodiments of the disclosure can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the disclosure comprise a data carrier having electronically readable control signals, which are capable of cooperating with a programmable computer system, such that one of the methods described herein is performed.

Generally, embodiments of the present disclosure can be implemented as a computer program product with a program code, the program code being operative for performing one of the methods when the computer program product runs on a computer. The program code may for example be stored on a machine-readable carrier.

Other embodiments comprise the computer program for performing one of the methods described herein, stored on a machine-readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium, or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example, via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the disclosure comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The herein described embodiments are merely illustrative for the principles of the present disclosure. It is understood that modifications and variations of the arrangements and the details described herein will be apparent to others skilled in the art. It is the intent, therefore, to be limited only by the scope of the Claims appended hereto and their equivalents and not by the specific details presented by way of description and explanation of the embodiments herein.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. An apparatus for testing a component, comprising:
   a first apparatus subportion configured to apply a respective one of a plurality of magnetic fields with a respective magnetic field orientation from a set of magnetic field orientations to the component;
   a second apparatus subportion configured to perform a test on the component in a presence of the respective one of the plurality of magnetic fields with the respective magnetic field orientation from the set of magnetic field orientations to obtain an information characterizing an operation of the component,
   wherein the test performed by the second apparatus subportion comprises one or more structural tests involving application of a plurality of digital test patterns to the component as a stimulus and further comprises evaluation of one or more responses of the component to the plurality of digital test patterns in the presence of the respective one of the plurality of magnetic fields with the respective magnetic field orientation from the set of magnetic field orientations; and a third apparatus subportion configured to determine a test result based on the information characterizing the operation of the component associated with the plurality of magnetic fields with the respective magnetic field orientation from the set of magnetic field orientations.

2. The apparatus of claim 1, wherein the test performed by the second apparatus subportion comprises identical one or more structural tests in a first presence of a first one of the plurality of magnetic fields with a first magnetic field orientation and in a second presence of a second one of the plurality of magnetic fields with a second magnetic field orientation.

3. The apparatus of claim 1, wherein the information characterizing the operation of the component comprises one or more performance metrics of the component associated with a first presence of a first one of the plurality of magnetic fields with a first magnetic field orientation and associated with a second presence of a second one of the plurality of magnetic fields with a second magnetic field orientation.

4. The apparatus of claim 1, wherein the test result is based on a difference between a first information characterizing the operation of the component associated with a first presence of a first one of the plurality of magnetic fields with a first magnetic field orientation and a second information characterizing the operation of the component associated with a second presence of a second one of the plurality of magnetic fields with a second magnetic field orientation.

5. The apparatus of claim 1, wherein the component comprises a semiconductor device including a plurality of logical functionalities, wherein the second apparatus subportion is configured to perform the test on the semiconductor device in a first presence of a first one of the plurality of magnetic fields with a first magnetic field orientation and in a second presence of a second one of the plurality of magnetic fields with a second magnetic field orientation, wherein the first one of the plurality of magnetic fields comprises a first magnetic field strength, wherein the second one of the plurality of magnetic fields comprises a second magnetic field strength, and wherein one of at least one of the logical functionalities or none of the logical functionalities interacts with the first one or the second one of the plurality of magnetic fields.

6. The apparatus of claim 1, wherein the component comprises one of a system-on-a-chip (SOC), a multi-chip-module (MCM), or a system-test board, wherein the second apparatus subportion is configured to perform the test on the component in a first presence of a first one of the plurality of magnetic fields with a first magnetic field orientation and a first magnetic field strength and in a second presence of a second one of the plurality of magnetic fields with a second magnetic field orientation and a second magnetic field strength, and wherein the first and second magnetic field strengths are one of a same strength or a different strength.

7. The apparatus of claim 1, wherein a magnetic field of the plurality of magnetic fields comprises one of a 3D magnetic field, a static magnetic field, a dynamic magnetic field, or a quasi-static magnetic field.

8. The apparatus of claim 1, wherein the first apparatus subportion comprises a magnetic field generator configured to generate the plurality of magnetic fields.

9. The apparatus of claim 1, wherein the respective one of the plurality of magnetic fields with the respective magnetic field orientation from the set of magnetic field orientations is configured to stress the component during the test.

10. The apparatus of claim 1, wherein the test result indicates a quality risk such that, if application of any one of the plurality of magnetic fields with the respective magnetic field orientation from the set of magnetic field orientations results in an abnormal operation of the component, the component is categorized as non-tolerant to environmental variations.

11. The apparatus of claim 1, wherein the test result comprises first information concerning a homogeneity of a manufacturing process related to the component.

12. The apparatus of claim 1, wherein the test comprises one of a memory-built-in-self test or a scan test.

13. The apparatus of claim 1, wherein the information characterizing the operation of the component comprises a first current consumption in a first presence of a first one of the plurality of magnetic fields with a first magnetic field orientation and a second current consumption in a second presence of a second one of the plurality of magnetic fields with a second magnetic field orientation.

14. The apparatus of claim 1, wherein the information characterizing the operation of the component comprises a first quiescent current in a first presence of a first one of the plurality of magnetic fields with a first magnetic field orientation and a second quiescent current in a second presence of a second one of the plurality of magnetic fields with a second magnetic field orientation.

15. The apparatus of claim 1, wherein the third apparatus subportion is further configured to compare the information characterizing the operation of the component with a predetermined threshold to determine the test result, and wherein the third apparatus subportion is configured to perform at least one of present the test result to a user or forward the test result to a remote server.

16. The apparatus of claim 1, wherein the respective one of the plurality of magnetic fields with the respective magnetic field orientation from the set of magnetic field orientations comprises a magnetic field strength of one of at least 100 mT, at least 300 mT, at least 500 mT, or at least 800 mT.

17. The apparatus of claim 1, wherein the information characterizing the operation of the component comprises at least one of a temperature, a current consumption, a switching voltage threshold, a switching speed, a functional frequency, a power consumption, a transconductance, a subthreshold voltage, a leakage current, or a subthreshold slope.

18. A method of testing a component, comprising:
applying a respective one of a plurality of magnetic fields with a respective magnetic field orientation from a set of magnetic field orientations to the component;
performing a test on the component in a presence of the respective one of the plurality of magnetic fields with the respective magnetic field orientation from the set of magnetic field orientations to obtain an information characterizing an operation of the component,
wherein said test comprises applying a plurality of digital test patterns to the component as a stimulus; and
determining a test result based on the information characterizing the operation of the component associated with the plurality of magnetic fields with the respective magnetic field orientation from the set of magnetic field orientations.

19. A computer-readable storage device comprising a plurality of computer-executable instructions stored therein, wherein the plurality of computer-executable instructions comprise:

instructions to apply a respective one of a plurality of magnetic fields with a respective magnetic field orientation from a set of magnetic field orientations to the component;

instructions to apply a plurality of digital test patterns to the component as a stimulus in a presence of the respective one of the plurality of magnetic fields with the respective magnetic field orientation from the set of magnetic field orientations to obtain an information characterizing an operation of the component; and instructions to determine a test result based on the information characterizing the operation of the component associated with the plurality of magnetic fields with the respective magnetic field orientation from the set of magnetic field orientations.

\* \* \* \* \*